United States Patent
Guo

(10) Patent No.: US 7,508,042 B2
(45) Date of Patent: Mar. 24, 2009

(54) SPIN TRANSFER MRAM DEVICE WITH MAGNETIC BIASING

(75) Inventor: Yimin Guo, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 29 days.

(21) Appl. No.: 11/644,132

(22) Filed: Dec. 22, 2006

(65) Prior Publication Data
US 2008/0151614 A1 Jun. 26, 2008

(51) Int. Cl.
*H01L 29/82* (2006.01)
*G11C 11/02* (2006.01)

(52) U.S. Cl. .......................... 257/427; 257/421; 438/3; 360/324.1; 365/149

(58) Field of Classification Search ......... 257/421–427; 438/3, 57, 800
See application file for complete search history.

(56) References Cited

U.S. PATENT DOCUMENTS

| | | | |
|---|---|---|---|
| 5,695,864 A | 12/1997 | Slonczewski | |
| 6,072,718 A * | 6/2000 | Abraham et al. | 365/173 |
| 6,335,890 B1 | 1/2002 | Reohr et al. | |
| 6,532,164 B2 | 3/2003 | Redon et al. | |
| 6,744,086 B2 | 6/2004 | Daughton et al. | |
| 6,771,534 B2 | 8/2004 | Stipe | |
| 6,980,469 B2 | 12/2005 | Kent et al. | |
| 7,006,375 B2 | 2/2006 | Covington | |
| 7,088,609 B2 | 8/2006 | Valet | |
| 7,126,202 B2 | 10/2006 | Huai et al. | |
| 2004/0130936 A1 * | 7/2004 | Nguyen et al. | 365/158 |
| 2005/0106810 A1 | 5/2005 | Pakala et al. | |
| 2006/0087880 A1 | 4/2006 | Mancoff et al. | |
| 2006/0092696 A1 | 5/2006 | Bessho | |

OTHER PUBLICATIONS

Osofsky et al, Materials Science and Engineering, B84, (2001), 49-52.*
J.Z. Sun, Physical Review B, 62, 570-578.*
Finocchio et al Physica B 372 (2006) 294-298.*
"Direct-Current Induced Dynamics in $Co_{90}Fe_{10}/Ni_{80}Fe_{20}$ Point Contacts", by W.H. Rippard et al., Physical Review Letters, vol. 92, No. 2, Wk ending Jan. 16, 2004, pp. 1-4.
"Current-driven exitation of magnetic multilayers", by J.C. Slonczewski, Journal of Magnetism and Magnetic Materials 159 (1996) 61-67, (c) 1996 Elsevier Science B.V. pp. 1-7.
"Spin-current interaction with a menodomain magnetic body : A model study", by J.Z. Sun, Physical Review 8, vol. 62, No. 1, Jul. 1, 2000, The American Physical Society, pp. 570-578.

* cited by examiner

*Primary Examiner*—Jerome Jackson, Jr.
*Assistant Examiner*—Jami M Valentine
(74) *Attorney, Agent, or Firm*—Saile Ackerman LLC; Stephen B. Ackerman

(57) ABSTRACT

The addition of segmented write word lines to a spin-transfer MRAM structure serves to magnetically bias the free layer so that the precessional motion of the magnetization vector that is set in play by the flow of spin polarized electrons into the free layer allows said magnetic vector to be switched rather than to oscillate between two easy axis directions.

4 Claims, 5 Drawing Sheets

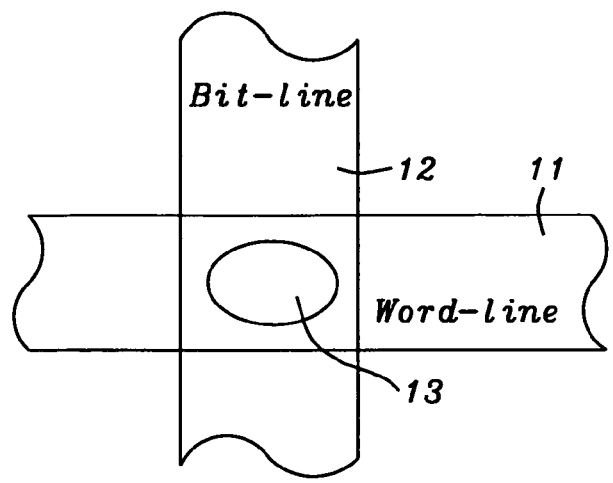
FIG. 1a – Prior Art
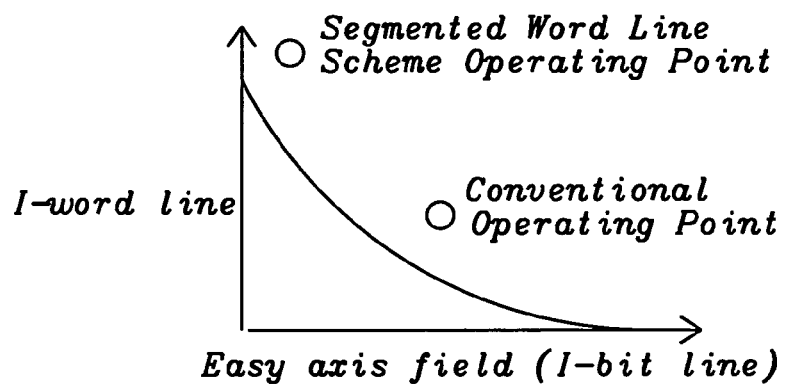
FIG. 1b – Prior Art
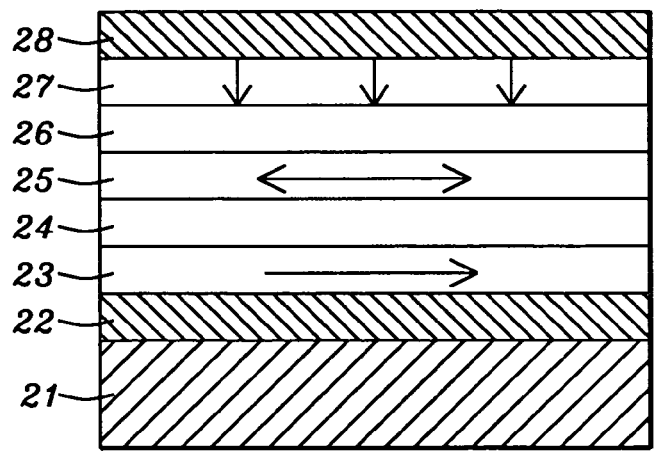
FIG. 2 – Prior Art

SPIN TRANSFER MRAM DEVICE WITH MAGNETIC BIASING

FIELD OF THE INVENTION

The invention relates to the general field of magnetic memories with particular reference to improving spin polarization in devices based on this.

BACKGROUND OF THE INVENTION

Magnetic random access memories (MRAMs) using magnetic tunneling junctions (MTJs) are strong candidates to provide a dense (area=~8-25 $f^2$, where f is the smallest feature size), fast (1~30 ns read/write speed), and non-volatile storage solution for future memory applications. The MTJ utilizes at least two magnetic layers that sandwich a thin dielectric insulting layer such as $Al_2O_3$, AlNxOy, or MgO, with one magnetic layer pinned by an anti-ferromagnetic film. To protect data from erasure or thermal agitation, an in-plane uniaxial magnetic anisotropy is needed for the magnetic free layer to store data.

As seen in FIG. 1a, the cross point of Word Line 11 and Bit Line 12 currents programs MTJ cell 13. The problem of keeping cells that share the same word line or bit line being disturbed is a major concern. Segmented Word Line approaches as described in "Segmented Write Line Architecture For Writing Magnetic Random Access Memories" [1] eliminate disturb conditions of cells on the same word line outside the selected segment. When the operating point is chosen deep along the hard axis, the required bi-directional bit line currents to program the selected cells are significantly reduced. The possibility of disturb along the bit line is also reduced. This is a most desirable MRAM operating condition.

Switching fields generated by word line and bit line currents for the conventional MRAM are about 30-60 Oe in intensity. For a segmented word line scheme, the bias field generated by the write word line is about 50-100Oe while the switching field generated by a bit line is about 15 Oe. The resulting shift of the uperating point is illustrated in FIG. 1b. For either case, the MRAM has to generate a relatively large magnetic field to rewrite recorder information so a relatively large electric current needs to flow through the address wirings.

As the device is further microminiaturized, the address wiring is reduced in width so that it becomes difficult to sustain the needed level of electric current. Furthermore, since the coercive force of the device is also increased, the current required to generate the necessary magnetic field, and hence the power consumption, is also increased.

For this reason, memory devices that use magnetization switching generated by spin transfer are receiving increased attention as an arrangement capable of switching the magnetization direction through application of a small electric current. In this scheme, reversal of the magnetic moment vector of the magnetic free layer is accomplished not by external magnetic fields, but by spin-polarized electrons passing perpendicularly through the stack of memory cell layers. A more detailed description is given in U.S. Pat. No. 5,695,864 by Slonczewski [2] and U.S. Pat. No. 6,532,164 by Redon et a. [3].

As described in the new concept outlined above, by sending an electric current through a magnetic layer having a particular magnetization, spins of electrons are oriented by quantum-mechanical magnetic exchange interaction with the result that the current carrying electrons leave the magnetic layer with a polarized spin. Alternatively, where spin-polarized electrons pass through a magnetic layer having a magnetic moment vector Hs in a preferred easy axis direction, these spin-polarized electrons will cause a continuous rotation of the magnetic moment vector. This may result in a reversal of the magnetic moment vector along its easy axis. Thus, switching of the magnetic moment vector between its two preferred directions along the easy axis may be effected by passing spin-polarized electrons perpendicularly through the magnetic layer.

Recent experimental data by Rippard et al. [4] confirm the very essence of magnetic moment transfer as a source of magnetic excitations and, subsequently, switching. These experiments confirm theoretical predictions by J. C. Slonczewski [5] and J. Z. Sun [6]) stating that the spin-transfer generated net torque term acting on the magnetization under conditions of a spin-polarized DC current is proportional to:

$$\Gamma = s\, n_m \times (n_s \times n_m)$$

where s is the spin-angular momentum deposition rate, $n_s$ is a unit vector whose direction is that of the initial spin direction of the current and $n_m$ is a unit vector whose direction is that of the free layer magnetization. The above equation indicates that the torque will be maximum when $n_s$ is orthogonal to $n_m$.

Prior art that uses this torque is described in both U.S. Pat. No. 6,532,164 [3] and U.S. 2006/0092696 [7]. FIG. 2 is a schematic cross-sectional view of a storage element comprising a single memory cell of the prior art. This storage element consists of under-layer 21, anti-ferromagnetic layer 22, magnetization fixed reference layer 23, tunneling barrier layer 24, free layer 25, nonmagnetic spacer layer 26, magnetic drive layer 27 and capping layer 28. As the direction of magnetization M1 of the magnetization fixed layer 23 is fixed to point to the right hand side. This free layer stores information based on whether the direction of the magnetization M2 is to the right or to the left. Also, since the tunneling barrier layer 24 is located between the free layer 25 and the fixed reference layer 23, constituting an MTJ element, its magneto-resistance is used to determine the direction of the magnetization of the free layer 25.

The magnetization direction in the polarizing (or drive} layer is set to be perpendicular to the film plane. Maintaining magnetization in a direction normal to the plane of a disk is, in general, difficult to achieve. However, certain materials, such as TbFeCo or GdFeCo, used together with CoFe, at a total thickness of about 300 Angstroms, support this. The result is a high level of spin polarization of the FeCo. Magnetization of this type (i.e. normal to the main surface of the disk) are set up by exposing the disk to a magnetic field of at least about 2,000 Oe.

Electrons passing through the layers depicted in FIG. 2 are spin-polarized after passing through magnetic drive layer 27 by the effect of magnetic exchange interaction. Since the magnetization in drive layer 27 is perpendicular to the film plane, the polarization direction, $n_s$, is also perpendicular to the plane of the magnetic free layer, resulting a torque on the free layer magnetization. When the current is large enough, it will overcome the anisotropy field in the free layer, resulting in a precessional movement within the film plane, causing its direction to switch back and forth at the precessional frequency. By controlling the current pulse duration precisely it is possible, in principle, to switch the free layer magnetization whenever required.

However, precession switching is a robust and fundamental effect. It is anticipated that maintaining such accuracy in the definition of the current pulse might prove to be extremely problematic, largely due to varying sources of impedance. Also the current density required for spin-torque switching is too large for ready integration with CMOS technology. Such a large current flowing across an MTJ tunneling barrier would generate long-term reliability problems.
1. U.S. Pat. No. 6,335,890 B1, W. R. Reohr, et al.
2. U.S. Pat. No. 5,695,864, J. C. Slonczewski
3. U.S. Pat. No. 6,532,164, Redon et al.
4. Phys. Rev. Lett. 92 (2004) 027201, W. H. Rippard et al.,
5. J. Magn. Magn. Mater. 159 (1996) LI, J. C. Sloncezwski,
6. Phys. Rev. B, Vol. 62, (2000) 570, J. Z. Sun
7. U.S. Pat. Pub. 2006/0092696 A1, K. Bessho A routine search of the prior art was performed with the following additional references of interest being found:

U.S. Pat. Nos. 7,126,202 (Huai) and U.S. Pat. No. 7,088,609 (Valet) disclose magnetization switching generated by spin-transfer when a write current passes through a magnetic element. U.S. Pat. No. 7,006,375 (Covington) teaches a hybrid write mechanism using spin-transfer and using a half-select process. U.S. Pat. No. 6,980,469 (Kent et al.) discloses an MRAM device using spin transfer.

U.S. Pat. No. 6,771,534 (Stipe) discloses a spin-transfer method with thermal assist, U.S. Pat. No. 6,774,086 (Daughton et al.) shows another spin-transfer method, and U.S. patent Publication 2006/0087880 (Mancoff et al.) discloses spin-transfer with write lines. U.S. patent application No. 2005/0106810 (Pakala et al.) describes reduction of spin transfer switching current by the presence of a stress-assist layer.

SUMMARY OF THE INVENTION

It has been an object of at least one embodiment of the present invention to provide a method for using spin polarization as a means to switch the direction of magnetization of the free layer of an MTJ.

Another object of at least one embodiment of the present invention has been that said method require lower bit and word line currents than are needed in similar devices of the prior art.

Still another object of at least one embodiment of the present invention has been to provide a process for manufacturing an MTJ that achieves the above objects.

These objects have been achieved by adding a write word line(s) to a spin-transfer MRAM structure. This serves to magnetically bias the free layer so that the precessional motion of the magnetization vector that is set in play by the flow of spin polarized electrons into the free layer allows said magnetic vector to be switched rather than to oscillate between the two easy axis directions.

This overcomes the problem of very tight control of the current pulse in a conventional device based on spin-transfer induced switching. This scheme may be further refined by adopting a segmented word line layout in which the write word line current is applied to a limited number of devices (on a shared word line) while spin currents are applied for each individual bit to write into their desired magnetic states. This is associated with significant power saving since multiple bits share the same word write line.

BRIEF DESCRIPTION OF THE DRAWINGS

FIG. 1a illustrates conventional cross-point addressing of a memory element.

FIG. 1b compares the operating points of conventional and segmented word line schemes.

FIG. 2 is a schematic cross-section of a memory element switched by spin polarization alone.

DESCRIPTION OF THE PREFERRED EMBODIMENTS

Figure 3A:
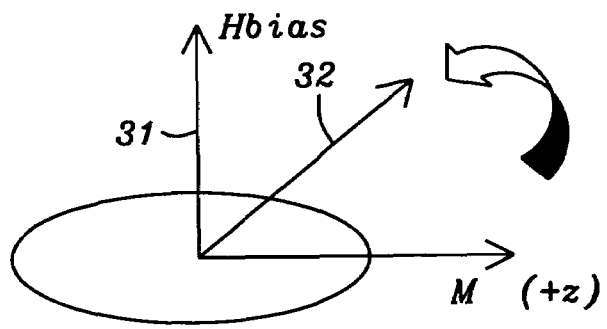
FIGS. 3a-3c illustrate the effects of magnetic bias on the precession of the free layer magnetic vector.

To solve the problems outlined in the earlier section, the present invention discloses a hybrid MRAM structure that combines spin-transfer with magnetic biasing. As shown in FIG. 3a, the electric current flowing in a write word line generates a magnetic field 31 to bias the magnetization 32 of the free layer toward its hard axis.

Figure 3B:
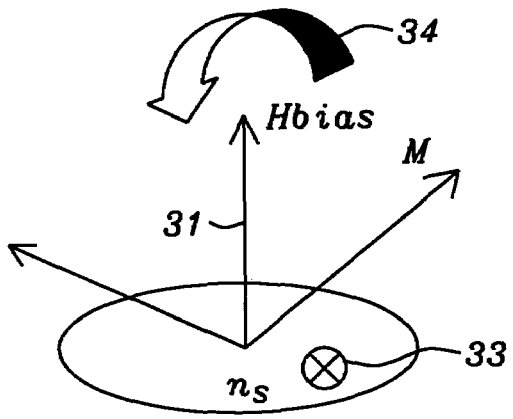
Figure 3C:
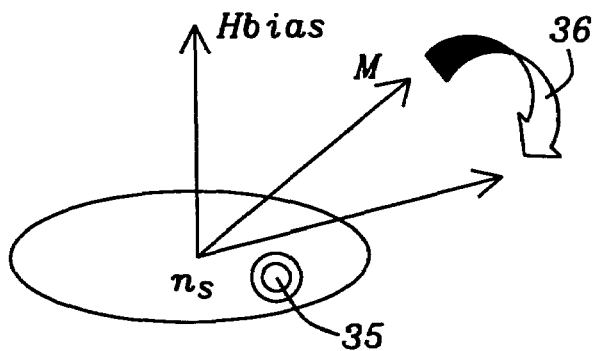

It is shown in FIG. 3b that, when spin direction 33 is into the paper the spin current generates torque 34 to help switch the magnetization of the free layer. As seen in FIG. 3c, when spin direction 35 is out of the paper, the spin current generated torque 36 only balances the bias field, rotating the free layer magnetization back towards its original easy axis direction.

Thus, the torque on the free layer magnetization is dependent upon the spin direction, which is in turn determined by the current flow direction and the magnetization of the drive layer. When electrons flow from drive layer to free layer, the current carries spins polarized in the same direction as the magnetization direction of drive layer, otherwise an opposite polarized spins will be carried by the current.

Figure 4:
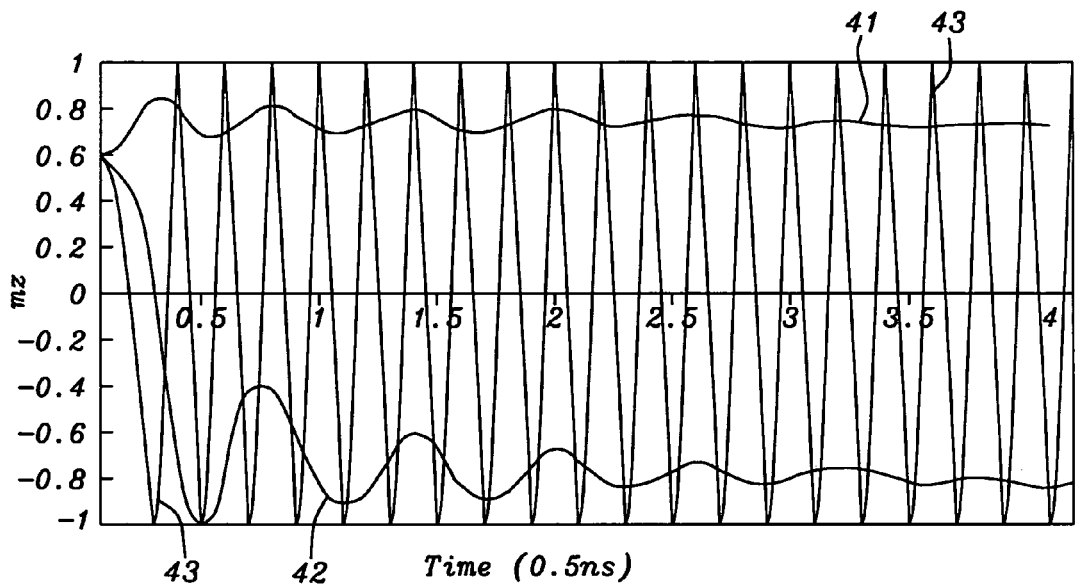
FIG. 4 shows the responses to spin polarization under various conditions.

In numerical calculations that we performed, a damping ratio of 0.01 was used. In FIG. 4, the top thick line 41 represents a typical response of not switching to a small current whose polarized spin direction is as shown in FIG. 3c; the bottom thick line 42 represents a typical response of switching when a small current having the polarized spin direction shown in FIG. 3b is used. When the spin current is too large, the torque generated arising from spin transfer overcomes both the anisotropy and bias fields, resulting in the sustained precessional movement shown by the oscillating thin line 43 seen in FIG. 4.

Figure 5:
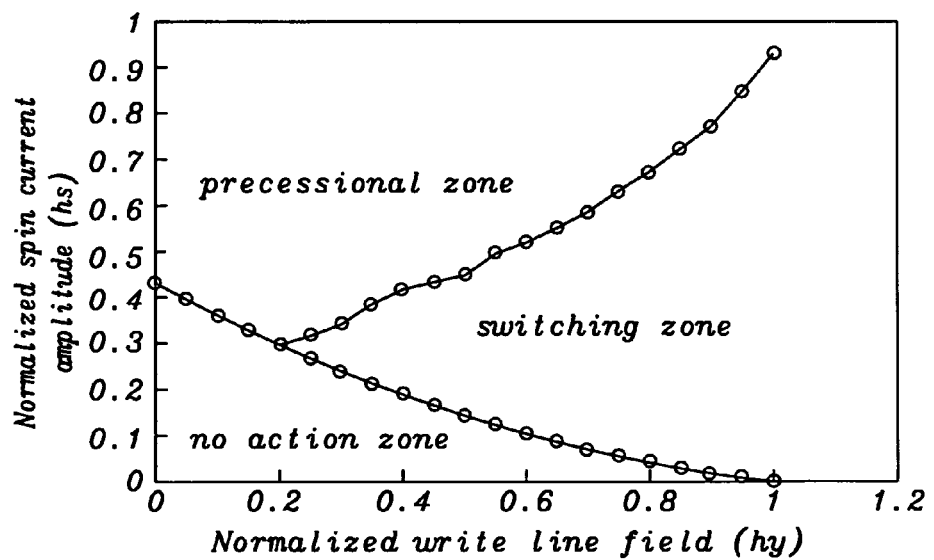
FIG. 5 shows how the response of the spin current to the bias field is of three types, each with its own zone of activity.

FIG. 5 shows the (calculated) response obtained when both a write current field and a non-zero spin current are present. The write line field, hy, is the write current biasing field normalized with respect to its anisotropy (sum of the in-plane shape and crystalline anisotropies) while hs is the spin current amplitude normalized with respect to its saturation value [3]. It is important to note that, in the absence of the biasing field associated with the write line current, no switching occurs when the spin current is below 0.43.

The free layer magnetization vector retains its precessional movement between the "1" and "0" states (i.e. two opposing directions along the easy axis) while the spin current is larger than 0.43. When a suitable write bias field is generated by the write line current and a much smaller spin current, roughly one tenth of conventional spin-transfer current, is now sufficient to switch the free layer magnetization into the desired state without further precession.

Figure 6:
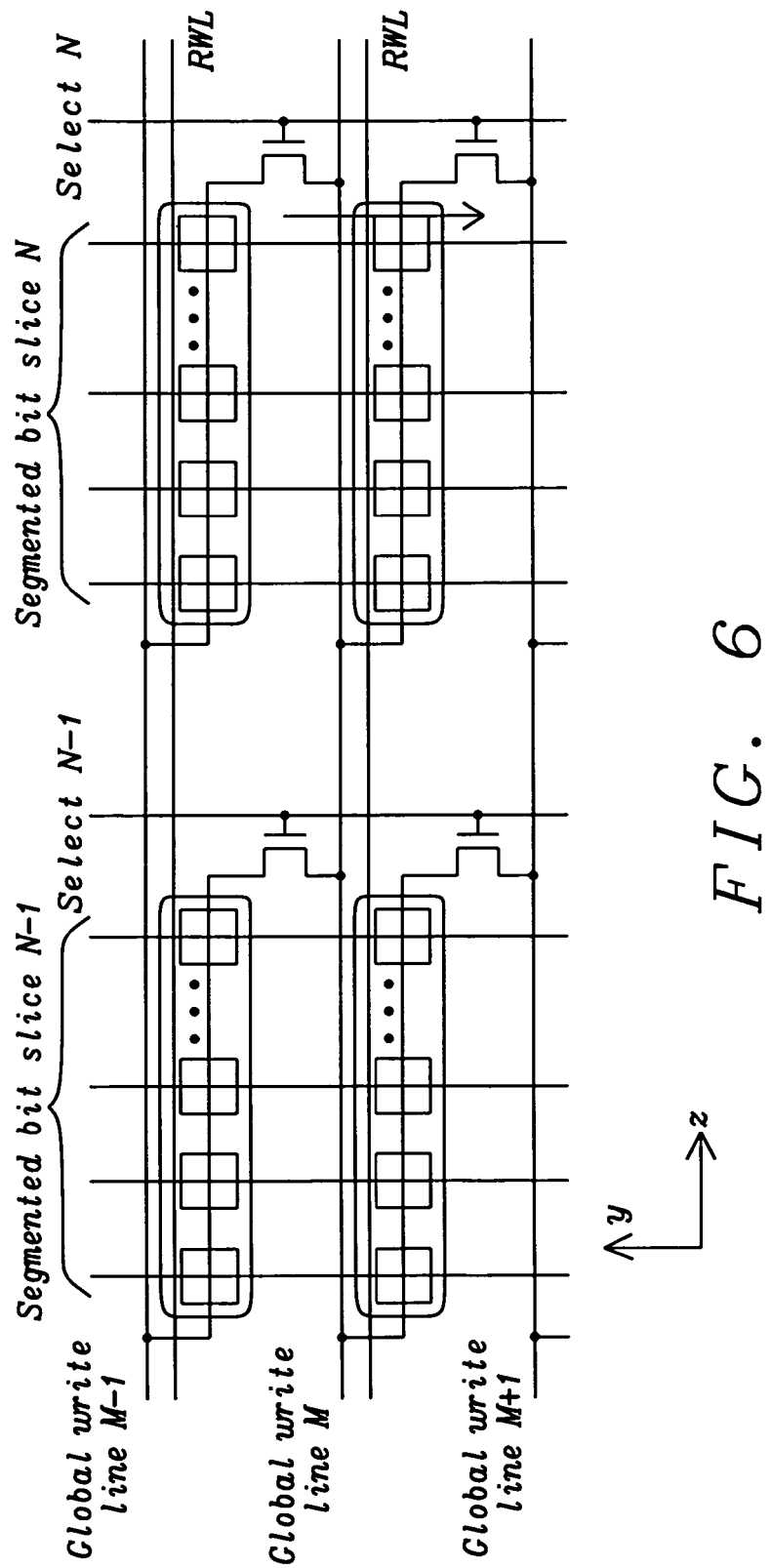
FIG. 6 illustrates the application of a segmented word line architecture to the present invention.
Figure 7:
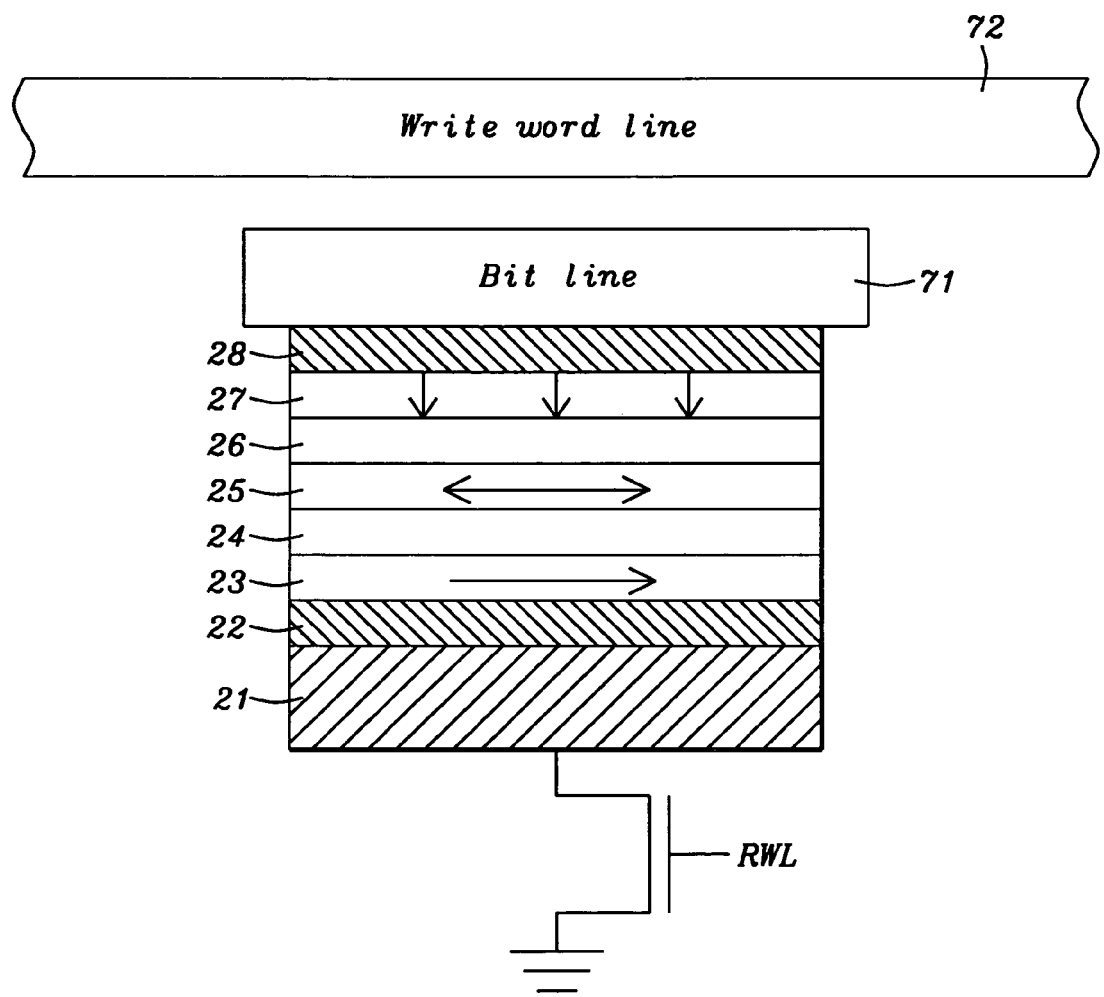
FIG. 7 is a schematic cross section of the structure of the invention, including bit and word lines.

The methodology and structure outlined above may be implemented within the segmentation of the word line array blocks as shown in FIG. 6. All MTJ cells that share the same write line 67 in a segmented bit line slice are half selected at the same time, while each individual cell is fully selected depending on the state "decided" by its bit line spin current direction between bit line and bottom electrode, as shown in FIG. 7.

In summary, segmented write word lines are added to a spin-transfer MRAM structure. The combination of write biasing field and spin current leads to a good write margin along with much reduced spin current and/or bit line current. The problem of very tight control of the current pulse is overcome through the spin-transfer induced switching which is well-controlled by the additional biasing field. As shown by the second embodiment, this can fit into a segmented word line scheme in which the write word line current is applied to a limited number of devices (on a shared word line) while spin currents are applied for each individual bit to write into their desired magnetic states. This is associated with significant power saving since multiple bits share the same word write line.

Last, but not least, due to the greatly reduced spin current density, the size of the transistor associated with each cell can be greatly reduced, making ultra-high density MRAM possible together with a greatly improved MTJ reliability.

What is claimed is:

1. A method to improve performance of a magnetic random access memory, comprising:

providing a driver layer having a magnetic easy axis that is normal to said driver layer's surface, whereby said driver layer provides a spin polarized electric current;

providing an MTJ magnetic memory element, having an anisotropy field whose direction of magnetization in a free layer may be switched by passing said spin polarized current through said free layer, said spin polarized current having, in the absence of any external magnetic field, a first minimum value;

providing a magnetic biasing field generated by a current in a wire that passes over said MTJ;

through application of said magnetic biasing field, at a magnitude that about equals or exceeds said anisotropy field, enabling said MTJ free layer to be switched by passing through said free layer a spin polarized current having a second minimum value that is less than said first minimum value; and thereby storing information through use of magnetization switching generated by spin transfer.

2. The method described in claim 1 wherein said first minimum value is at least two times said second minimum value.

3. The method described in claim 1 wherein said current that generates said magnetic biasing field is between about 1 and 20 mA whereby said magnetic biasing field is between about 10 and 200 Oe.

4. The method described in claim 1 wherein said wire passes within about 0.5 microns of said memory element.

* * * * *